(12) United States Patent  (10) Patent No.: US 8,129,201 B2
Okamoto  (45) Date of Patent: *Mar. 6, 2012

(54) STACKING APPARATUS AND METHOD FOR STACKING INTEGRATED CIRCUIT ELEMENTS

(75) Inventor: Kazuya Okamoto, Yokohama (JP)

(73) Assignee: Nikon Corporation, Tokyo (JP)

( * ) Notice: Subject to any disclaimer, the term of this patent is extended or adjusted under 35 U.S.C. 154(b) by 287 days.

This patent is subject to a terminal disclaimer.

(21) Appl. No.: 12/230,095

(22) Filed: Aug. 22, 2008

(65) Prior Publication Data

US 2009/0004762 A1  Jan. 1, 2009

Related U.S. Application Data

(63) Continuation of application No. 11/481,250, filed on Jul. 6, 2006, now Pat. No. 7,427,517, which is a continuation of application No. PCT/JP2005/000101, filed on Jan. 7, 2005.

(30) Foreign Application Priority Data

Jan. 7, 2004 (JP) ................. 2004-002081

(51) Int. Cl.
 *H01L 21/00* (2006.01)
(52) U.S. Cl. .......... 438/6; 438/15; 438/401; 438/975; 257/777; 257/797; 257/E21.509; 228/103
(58) Field of Classification Search ............... 438/6, 15, 438/401, 975; 257/777, 797, E21.509; 228/103
 See application file for complete search history.

(56) References Cited

U.S. PATENT DOCUMENTS

| | | | |
|---|---|---|---|
| 4,612,083 | A | 9/1986 | Yasumoto et al. |
| 4,780,617 | A | 10/1988 | Umatate et al. |
| 5,270,261 | A | 12/1993 | Bertin et al. |

(Continued)

FOREIGN PATENT DOCUMENTS

EP  0 168 815 A2  1/1986

(Continued)

OTHER PUBLICATIONS

Thornwood—Automatic Method for Registration and Stacking of Laminates—IBM Technical Disclosure Bulletin—vol. 33—No. 7—Dec. 1990—pp. 410-414—International Business Machines Corp.—USA.

*Primary Examiner* — Tu-Tu Ho
(74) *Attorney, Agent, or Firm* — Morgan, Lewis & Bockius LLP (57) ABSTRACT

A stacking apparatus that stacks chip assemblies each having a plurality of chips disposed continuously with circuit patterns and electrodes, includes: a plurality of stages each allowed to move arbitrarily, on which the chip assemblies are placed; a storage unit that stores an estimated extent of change in a position of an electrode at each chip, expected to occur as heat is applied to the chip assemblies placed on the plurality of stages during a stacking process; and a control unit that sets positions of the plurality of stages to be assumed relative to each other during the stacking process based upon the estimated extent of change in the position of the electrode at each chip provided from the storage unit and position information indicating positions of individual chips formed at the chip assemblies and controls at least one of the plurality of stages.

36 Claims, 4 Drawing Sheets

U.S. PATENT DOCUMENTS

| | | |
|---|---|---|
| 6,168,678 B1 | 1/2001 | Plankenhorn et al. |
| 6,640,423 B1 * | 11/2003 | Johnson et al. .................. 29/740 |
| 7,427,517 B2 * | 9/2008 | Okamoto ........................... 438/6 |
| 2001/0021569 A1 | 9/2001 | Noda ............................ 438/455 |
| 2001/0042772 A1 * | 11/2001 | Narita et al. .................... 228/41 |
| 2002/0017709 A1 | 2/2002 | Yanagisawa et al. ......... 257/686 |
| 2002/0074630 A1 | 6/2002 | Ando et al. |
| 2003/0166313 A1 | 9/2003 | Nishikawa et al. |
| 2003/0168176 A1 * | 9/2003 | Byun et al. .................... 156/382 |

FOREIGN PATENT DOCUMENTS

| | | |
|---|---|---|
| JP | 61-44429 | 3/1986 |
| JP | 3-98719 | 4/1991 |
| JP | 4-076946 | 3/1992 |
| JP | A-07-014982 | 1/1995 |
| JP | A-2000-294724 | 10/2000 |
| JP | A-2001-210783 | 8/2001 |
| JP | A-2001-298146 | 10/2001 |
| JP | A-2002-151642 | 5/2002 |
| JP | 2003-100943 | 4/2003 |
| JP | A-2005-026346 | 1/2005 |
| KR | 20-0108386 | 7/1995 |
| KR | 10-1998-0015839 | 5/1998 |
| KR | 10-1999-0051382 | 7/1999 |

* cited by examiner

STACKING APPARATUS AND METHOD FOR STACKING INTEGRATED CIRCUIT ELEMENTS

This application is a continuation of Application No. 11/481,250, filed on Jul. 6, 2008, now U.S. Pat. No. 7,427,517 which is hereby incorporated by reference, and which is a continuation of International Application No. PCT/JP2005/000101 filed Jan. 7, 2005.

INCORPORATION BY REFERENCE

The disclosures of the following priority applications are herein incorporated by reference:
International Application No. PCT/JP2005/000101 filed Jan. 7, 2005; and
Japanese Patent Application No. 2004-002081 filed Jan. 7, 2004.

BACKGROUND OF THE INVENTION

1. Field of the Invention

The present invention relates to a stacking apparatus that stacks chip blocks each having a circuit pattern formed therein, one on top of another so as to assure electrical conduction of electrodes at the individual chip blocks and it also relates to a method for stacking integrated circuit elements.

2. Description of Related Art

Increasingly higher speed and higher performance in CMOS-FET (complementary MOS field effect transistors), the basic component in semiconductor devices today, have been realized through supermicro processing technologies, the primary example of which is lithography. However, beyond the 45 to 65 nm node range (when the DRAM gate half pitch is in the 45 to 65 nm range or beyond) the signal delay in the global wiring used to couple the individual IPs (functional circuit assemblies referred to as intellectual properties) within a chip becomes a crucial issue to be dealt with.

The conventional countermeasures having been taken so far against the signal delay, i.e., the use of wiring constituted with a low-resistance material such as Cu and the use of a low-K material to lower the capacitance, are no longer sufficiently effective and it is now necessary to use an additional compensating circuit (repeater). However, the addition of the compensating circuit inevitably increases the chip size and also increases the power consumption.

At the same time, to keep pace with the increasing popularity of portable telephones and the like, even smaller LSIs with more diverse functions are required. While the use of three-dimensional integrated circuits achieved by stacking vertically chips having formed therein two-dimensional circuit patterns is becoming increasingly common as a solution to meet those requirements, chips may be conceivably formed through stacking by adopting any of several different modes.

In a first mode, good LSI chips are selected, they are mounted in a low-profile package and then the individual packages are stacked one on top of another. In a second mode, entire chips or wafers are stacked together. Each mode has its own advantages and disadvantages.

While the yield can be sustained at a certain level by adopting the first mode, in which good chips are selected and stacked, the package cost is bound to be significant. In addition, additional connecting wiring must be disposed between the chips and the packages, setting limits to the signal speed that can be achieved.

The second mode may be achieved through either of two different methods. In the first method, after chips are stacked, pads at each chip are connected through wiring (wire-bonded). While this method is very advantageous, in particular in conjunction with inexpensive chips or memory modules, the chips are ultimately connected through wiring and thus, a wiring delay is bound to occur. For this reason, this option is not suitable for integrated circuits that have to assure high speed transmission. In the second method, through electrodes are mounted in advance in chips and they are directly connected via bumps or the like on the chips.

Accordingly, various next-generation systems for overcoming the limits to miniaturization set in consideration of the device cost and the design capacity requirements by, for instance, adopting special transistor structures, e.g., SOIs (silicon-on-insulator) structures and strained Si channel structures or adopting optical wiring have been put into practical use or have been proposed.

In view of the signal delay occurring in the ultimate mounting area, the Si through electrode system disclosed in U.S. Pat. No. 4,612,083 is considered to be very promising. This system is also effective when adopted in an integrated circuit that transmits signals in parallel at high speed. U.S. Pat. No. 5,270,261 and Japanese Laid Open Patent Publication No. H7-14982 disclose methods for achieving such integrated circuits by stacking wafers having formed therein circuit patterns one on top of another and achieving electrical conduction through direct contact of the chip electrodes formed at the individual wafers.

SUMMARY OF THE INVENTION

In the methods mentioned above, the wafers being stacked are aligned so as to set the chips at the individual wafers at predetermined positions and thus achieve electrical conduction for the chips. However, it is difficult to achieve electrical conduction for all the chips formed at a wafer with the chips formed at another wafer, and for this reason, a sufficiently large yield is still not achieved by adopting these methods.

The present invention provides a method that achieves high yield in the production of stacked chips manufactured by stacking wafers one on top of another, each having a plurality of chips with circuit patterns formed therein or chip groups each having a plurality of chips disposed continuously (hereafter, such wafers or chip groups are referred to as chip assemblies).

According to the 1st aspect of the present invention, a stacking apparatus that stacks chip assemblies each having a plurality of chips disposed continuously with circuit patterns and electrodes, comprises: a plurality of stages each allowed to move arbitrarily, on which the chip assemblies are placed; a storage unit that stores an estimated extent of change in a position of an electrode at each chip, expected to occur as heat is applied to the chip assemblies placed on the plurality of stages during a stacking process; and a control unit that sets positions of the plurality of stages to be assumed relative to each other during the stacking process based upon the estimated extent of change in the position of the electrode at each chip provided from the storage unit and position information indicating positions of individual chips formed at the chip assemblies and controls at least one of the plurality of stages.

According to the 2nd aspect of the present invention, in the stacking apparatus according to the 1st aspect, it is preferred that there is further provided an alignment information obtaining unit that obtains the position information indicating the positions of the individual chips from a projection exposure apparatus that determines the circuit patterns at the chips at the chip assemblies; and the control unit is able to obtain the position information for the individual chips from the alignment information obtaining unit.

According to the 3rd aspect of the present invention, in the stacking apparatus according to the 1st aspect, it is preferred that there is further provided an alignment measurement unit that measures the positions of the individual chips formed at the chip assemblies; and the control unit is able to obtain the position information for the individual chips from the alignment measurement unit.

According to the 4th aspect of the present invention, in the stacking apparatus according to any of the 1st through 3rd aspects, it is preferred that the control unit determines the positions of the stages to be assumed during the stacking process based upon a misalignment manifesting between reference positions set for the stages and reference positions set for the chip assemblies placed on the stages.

According to the 5th aspect of the present invention, in the stacking apparatus according to the 4th aspect, it is preferred that there is further provided a bonding OK/NG deciding unit that makes a decision as to whether or not to start a bonding step by evaluating a difference between positions of each pair of electrodes at chips present at the chip assemblies and to be stacked based upon stacking position information indicating positions to be assumed by the individual chip assemblies for the stacking process, which are set by the control unit.

According to the 6th aspect of the present invention, in the stacking apparatus according to the 4th or the 5th aspect, it is preferred that there is further provided a division information output unit that generates chip assembly division information in correspondence to a positional relationship between electrodes at the stacked chip assemblies and outputs the chip assembly division information to a dicing device that divides the chip assemblies.

According to the 7th aspect of the present invention, in the stacking apparatus according to any of the 1st through 6th aspects, it is preferred that a plurality of pressure application detection unit are disposed at least one of the plurality of stages.

According to the 8th aspect of the present invention, an integrated circuit element stacking method for stacking a plurality of chip assemblies each having chips ith circuit patterns and electrodes formed therein disposed continuously, comprises: a position information obtaining step in which position information indicating positions of the individual chips formed at the chip assemblies is obtained; a positioning step in which the chip assemblies to be stacked are positioned relative to each other based upon the position information indicating the positions of the individual chips obtained through the position information obtaining step and information related to positions of electrodes at the chips that change in correspondence to a temperature to which the chip assemblies are heated during the stacking process; and a bonding step in which the chip assemblies having become positioned relative to each other are pressure bonded with each other.

According to the 9th aspect of the present invention, in the integrated circuit element stacking method according to the 8th aspect, it is preferred that in the positioning step, the chip assemblies to be stacked are positioned in correspondence to a misalignment manifesting between a stage reference position assumed at a stage on which the chip assembly is placed during the bonding step and a reference position set for the chip assembly placed on the stage.

According to the 10th aspect of the present invention, a stacking apparatus that stacks chip assemblies each having a plurality of chips disposed continuously with circuit patterns and electrodes, comprises: a plurality of stages each allowed to move arbitrarily, on which the chip assemblies are held; a chip position information obtaining unit that obtains position information indicating positions of the chips at the individual chip assemblies held at the plurality of stages; and a bonding unit for bonding the chip assemblies based upon the position information indicating the positions of the chips at the individual chip assemblies obtained by the chip position information obtaining unit.

DESCRIPTION OF PREFERRED
EMBODIMENT(S)

Figure 1:
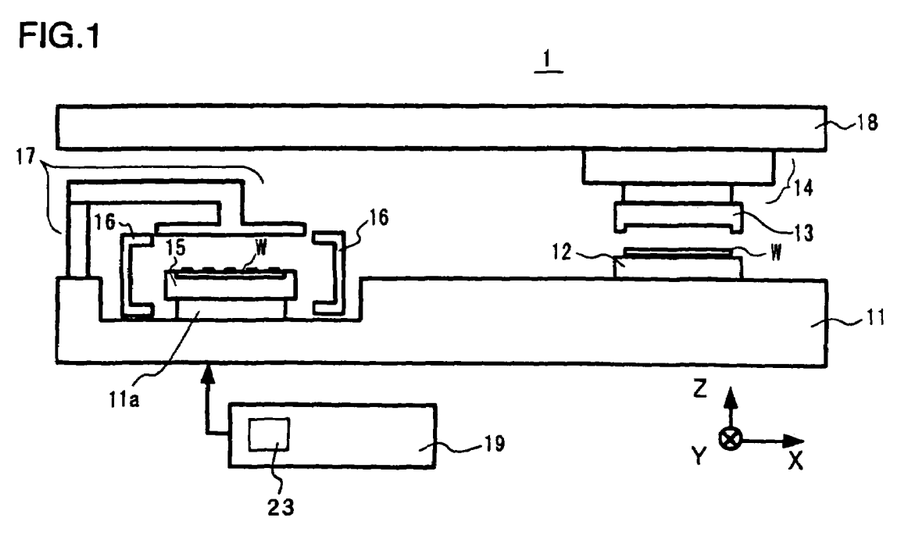
FIG. 1 schematically shows the structure adopted in the stacking apparatus 1 achieved in an embodiment.
Figure 2:
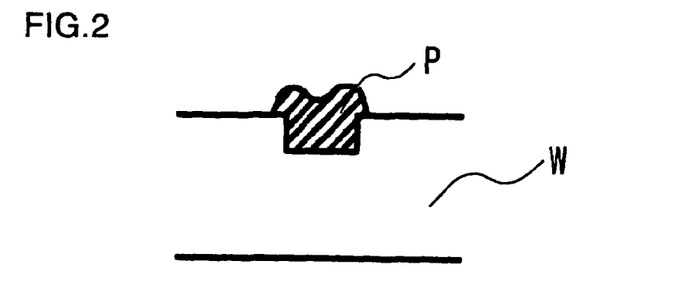
FIG. 2 is an enlarged sectional view of a bump formed at a diffused wafer W.

In reference to FIG. 1, the stacking apparatus achieved in an embodiment of the present invention is explained. This stacking apparatus 1 includes a stage 11a locked onto a base 11, at which a lower wafer holder 15 is mounted, a wafer stage 12, an upper wafer holder 13 that holds a wafer, a chucking unit 14 that carries the wafer holder 13 held thereat, a transfer mechanism that movably supports the chucking unit 14, a clamping unit that clamps the upper wafer holder 13 and the lower wafer holder 15, a second transfer mechanism 17 that transfers a wafer to be set at the lower wafer holder 15 and also transfers the upper wafer holder 13 and the lower wafer holder 15 clamped together via the clamping unit 16, and a control unit 19 that controls the individual stages, the individual transfer mechanisms and the like. In addition, although not shown in FIG. 1, the stacking apparatus includes an alignment processing device. It is to be noted that another stage is constituted with the transfer mechanism 18, the chucking unit 14 and the upper wafer holder 13.

Figure 5:
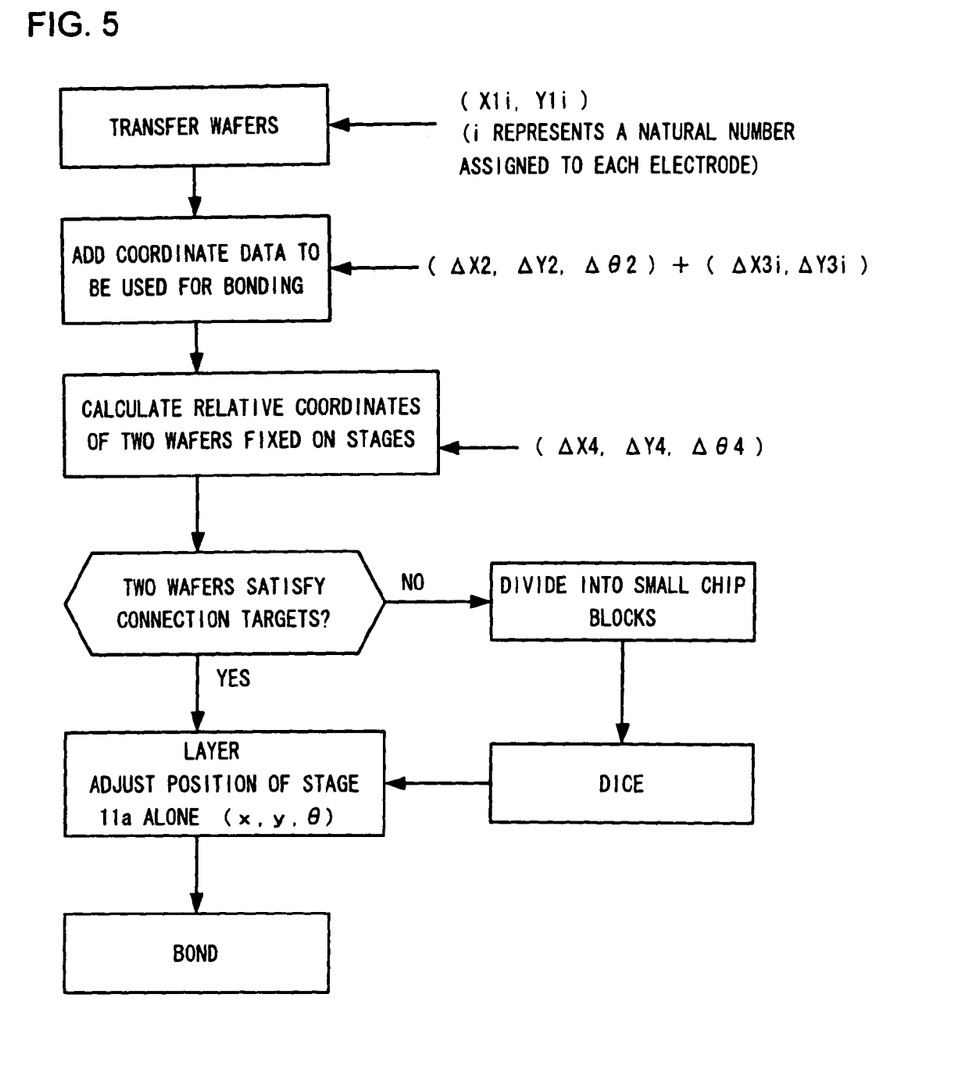
FIG. 5 presents a flowchart of the stacking process executed in the stacking apparatus 1 in the embodiment.

The stacking apparatus 1 positions diffused wafers W having been patterned by a projection exposure apparatus so as to include wiring patterns and electrode patterns with electrodes formed therein achieving identical electrode array patterns (in the case of dummy electrodes or the like, the array pattern may be different) by aligning the electrodes at one wafer with the electrodes at another wafer and bonds the wafers to each other. It is to be noted that FIG. 5 shows the stacked chip manufacturing process executed by employing this stacking apparatus 1. Next, in reference to FIGS. 5 and 1, the stacking process is explained.

First, as indicated in FIG. 5, wafers are transferred. In this step, diffused wafers W having electrodes formed therein are placed on the wafer stage 12 and at the lower wafer holder 15. It is to be noted that the diffused wafers W placed on the wafer stage and at the lower wafer holder will have already undergone the inspection process. Through the inspection process, the height (specifically, the co-planarity) of the bumps formed at the electrode patterns, the shape of the electrodes such as the bumps and the vias are inspected.

The bump height is inspected by measuring the heights of all the bumps formed over the entire surfaces of the diffused wafers W. If the bump heights are markedly inconsistent, electrical conduction may not be achieved for the diffused wafers W bonded to each other since the bumps at one of the wafers may not contact the bumps at the other wafer due to insufficient height of some of the bumps. For this reason, the bumps need to achieve heights within a predetermined range.

A three-dimensional shape measuring instrument or an image shape measuring device should be used as the means for measuring the heights and shapes of the bumps. A CNC image measuring device in the VMR series from Nikon is ideal for such purposes.

It is also necessary to inspect the shapes of the vias formed at the diffused wafers. The inspection of the vias is essential for making an accurate judgment as to whether or not the wiring material formed in the vias demonstrates satisfactory electrical characteristics (e.g., electrical conduction). Measurement of the roughness of the via sidewalls is particularly important, and for this reason, it is desirable to inspect the vias at the diffused wafers W with an infrared microscope, an x-ray microscope or the like that uses light transmitted through silicon.

The individual chips formed on the diffused wafers W also need to be inspected to ensure their full functionality. Only diffused wafers W having cleared such predetermined criteria as those detailed above are selected and carried to the stacking apparatus 1 where they are placed on the wafer stage 12 and at the lower wafer holder 15.

Next, the stacking apparatus 1 obtains coordinate data indicating the coordinates of the individual chips formed at the diffused wafers. The control unit 19 of the stacking apparatus 1 includes a communication port (not shown) that enables communication with another semiconductor manufacturing apparatus. Communication with the projection exposure apparatus that formed electrodes and the wiring patterns at the diffused wafers through patterning is enabled via the communication port. In addition, circuit pattern information on the circuit patterns formed at the individual chips can be obtained from the circuit design tool via the communication port as well.

When forming a multilayer wiring pattern through layered exposure in the projection exposure apparatus that patterns diffused wafers W, the projection exposure apparatus executes enhancement global alignment to detect misalignment of the individual patterns relative to a reference position set for the diffused wafers W. Since details of the enhancement global alignment are technical matters disclosed in Japanese Laid Open Patent Publication No. S61-44429 or Japanese Laid Open Patent Publication No. S62-84516 and are thus known to persons skilled in the art, the description of the present invention does not include an explanation thereof.

The projection exposure apparatus, which first positions the various patterns such as electrode patterns through the enhancement global alignment and then projection-exposes them onto wafers, holds data indicating the specific positions at which the various chips are formed at each diffused wafer W relative to a reference position (e.g., a notch formed in advance at the wafer) set on the diffused wafer W.

Accordingly, the stacking apparatus 1 is enabled to communicate with the projection exposure apparatus that determines the circuit patterns at the diffused wafer W and thus is able to obtain position information indicating the positions of the individual chips at the diffused wafer W set on the wafer stage 12 and at the lower wafer holder 15, and is also able to obtain circuit pattern information from the circuit design tool. In other words, all the information required to obtain electrode array position data ($X1i$, $Y1i$) corresponding to each chip i are accessible to the stacking apparatus. It is to be noted that i represents a natural number assigned to each of the chips formed at the diffused wafer W. It is to be also noted that chips may be connected wirelessly, instead of via the electrodes formed at the chips. In the case of wireless chip connection, array position data corresponding to a specific area of the circuit pattern, instead of the electrode array position data, may be used.

It goes without saying that the stacking apparatus 1 may include mounted thereat an alignment processing device similar to that in the projection exposure apparatus. The stacking apparatus equipped with a similar alignment processing device is able to obtain equivalent information on diffused wafers W prepared via a projection exposure apparatus not equipped with the alignment processing device.

In more specific terms, it is preferable that the stacking apparatus may include mounted thereat a wafer microscope with which patterns formed at a diffused wafer W can be recognized. The position of an alignment mark on the surface of the diffused wafer W can be measured with the wafer microscope and the electrode array position data ($X1i$, $Y1i$) corresponding to each chip can be obtained by incorporating the measurement results with the design data for the circuit patterns formed at the chips.

The alignment processing device is set along the Y direction (further backward relative to the drawing sheet surface) relative to the stacking apparatus 1 in FIG. 1. Diffused wafers W travel between the wafer stage 12 and the alignment processing device and between the lower wafer holder 15 and the alignment processing device via the chucking unit (not shown).

Figure 6:
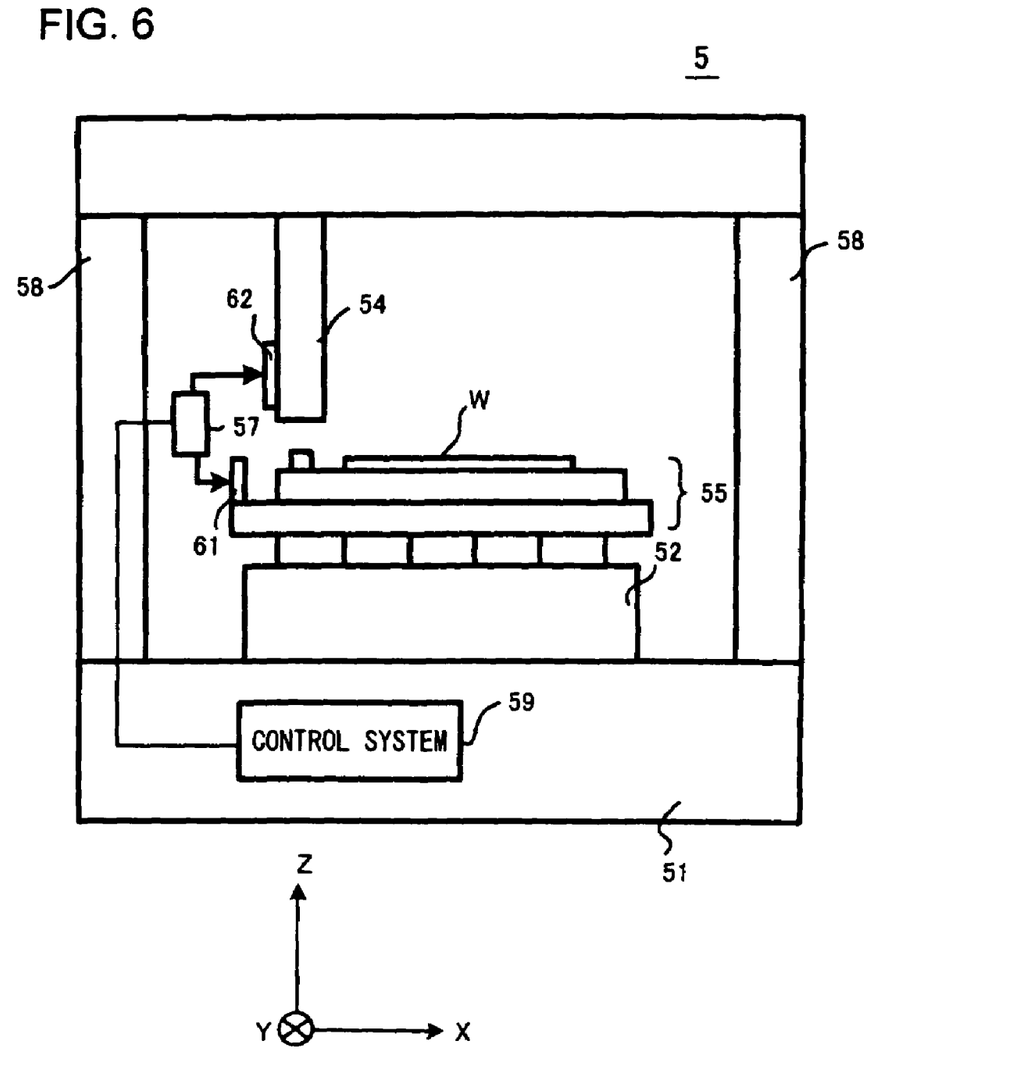
FIG. 6 schematically shows the structure adopted in the alignment processing device in the embodiment.

FIG. 6 schematically shows the structure adopted in the alignment processing device. The alignment processing device 5 includes a base stage 52 disposed on a base 51 and a table 55 disposed on the base stage 52, at which a diffused wafer W is held. In addition, a wafer microscope 54 is disposed above the surface of the table 55 on which the diffused wafer is set, via a post 58 disposed on the base 51. The table 55 is allowed to move at least within a plane ranging perpendicular to the direction Z in the figure. The alignment processing device also includes a light wave interferometer 57 that uses a movable mirror 61 fixed onto the table 55 and a fixed mirror 62 fixed onto the lens barrel of the wafer microscope 54.

It is to be noted that the alignment processing device is equipped with a plurality of light wave interferometers 57 so as to measure the distance traveled along two directions running perpendicular to each other. The information provided by the light wave interferometers 57 and mark detection information provided by the wafer microscope 54 are all input to a control system 59. In addition, design data defining the chip positions in the chip array are input to the control system 59 from the projection exposure apparatus or the like. The circuit pattern information is also taken into the control system 59 from the circuit design tool. More specifically, the control system is connected with the devices holding these design data via a communication port. The control system 59 also executes drive control of the table 55.

The position of each chip in the array is ascertained via the alignment processing device 5 through the following procedure. A diffused wafer W is placed on the table 55 by setting a notch formed at the wafer at a predetermined position on the table 55. Then, the table 55 is driven based upon the design data defining the chip array positions and the alignment marks for the individual chips are detected through the wafer microscope 54. However, instead of detecting the alignment marks for all the chips, the alignment marks formed at three or more selected chips on the diffused wafer W are detected. Thus, the positions of some of the chips on the diffused wafer W are detected.

Next, the control system 59 compares the detected chip positions with the positions indicated in the design data defining the chip array positions and determines error parameters. It is to be noted that if the extent of error varies from chip to chip, the error parameters should be determined by adopting the method of least squares or the like. Next, the positions of all the chips in the array are estimated based upon the error parameters and the design data. It is to be noted that as mentioned earlier, Japanese Laid Open Patent Publication No. S 61-4429 discloses a specific method of arithmetic processing that may be executed in the control system.

It is to be noted that the alignment processing device 5 includes a heating unit installed at the table 51 to heat the diffused wafer W and a temperature detection unit that detects the temperature of the diffused wafer W (neither shown). The heating unit is constituted with a heater installed within the table 55 and the quantity of heat generated at the heater is controlled by the control system 59. In addition, the temperature detection unit is constituted with a thermocouple installed at the surface of the table 55. However, means other than these may be used, instead.

The alignment processing device 5 is equipped with the heating unit and the temperature detection unit for the following reason. Diffused wafers W are heated while they are bonded to each other. In order to determine the extent to which the diffused wafers become thermally deformed during this heating step, the diffused wafer W on the table is heated until its temperature reaches a level equal to the bonding temperature and the extents of displacement of the circuit patterns and the electrodes at the individual chips are measured in this state. In this case, too, instead of measuring the extents of displacement of all the chips at the diffused wafer W, the extents of displacement of some of the chips may be measured and the extents and the directions of displacement of the individual areas at the diffused wafer W may be estimated in correspondence to the various chips. At this time, the positions of the individual chips may be estimated by taking into consideration any possible changes occurring in the thermal deformation attributable to the presence of impurity diffusion areas based upon the circuit pattern information indicating the impurity diffusion areas.

It is to be noted that since the optical paths of the light wave interferometers 57 in the alignment processing device 5 are also heated, a significant measurement error, attributable to slight movements of the air in the optical paths and the like, occurs. Accordingly, light wave interferometers that measure interference of light waves with varying wavelengths are used in the embodiment to enable accurate positional measurement by eliminating the adverse effect of the shifting of the air. Such interferometers may each be constituted with, for instance, the two-wavelength interferometer disclosed in Japanese Laid Open Patent Publication No. H5-302809. Another option for assuring accurate positional measurement is to use an alignment processing device not equipped with a heating unit.

For instance, data indicating the bonding results may be retained in a database. Namely, two dummy wafers with wiring patterns identical to those of wafers to be actually manufactured are prepared. The dummy wafers each include verniers constituted of metal (e.g., Cu) manifesting contrast detectable via a microscope that uses infrared light transmitted through Si or box marks used in ordinary light wave measurement, disposed at a plurality of positions. The dummy wafers are then heated to a temperature equal to the bonding temperature, the verniers or the box marks are observed through the microscope that uses light transmitted through Si and the extents of thermal deformation of the wafers are determined by detecting the positions of the individual marks.

For instance, a vernier may be disposed at one of the dummy wafers with pitches different from the pitches with which the vernier marks are disposed at the other dummy wafer. Then, a pair of substantially matching marks, one formed at one of the dummy wafers and the other formed at the other dummy wafer, is detected with the microscope using light transmitted through Si, and the extent of thermal deformation can be ascertained based upon the position of these marks. Alternatively, the extent of thermal deformation may be measured by using box marks. In this case, the difference between the central position of a box mark formed at one of the dummy wafers and the central position of a box mark formed at the other dummy wafer is detected with the microscope using light transmitted through Si, both before and after the heating step and the extent of thermal deformation is thus ascertained.

After bonding the two wafers to each other while heating them at the predetermined temperature over the predetermined length of time as dictated by the process conditions, the extent of their misalignment is quantized over the entire wafer range. Then, the data are stored into a memory 23 at the control unit 19 of the stacking apparatus 1 or a database unit (not shown) with which communication is enabled via the communication port of the control unit 19. The data thus stored are accessible for a subsequent read. In this case, advantages similar to those described earlier are achieved without equipping the stacking apparatus with multiple wavelength interferometers. The extent of displacement attributable to the heat application can be estimated through simulation instead of via the alignment processing device 5 as described earlier. It is to be noted that since the extent of deformation varies from one temperature level to another, the extents of displacement of the electrodes at the individual chips should be measured at each temperature level.

The alignment processing device 5 determines the positions of the electrodes at the individual chips by ascertaining the positions of the electrodes relative to the alignment marks at the chips based upon the design data input to the control system 59 and using the electrode position data in combination with the chip array position data indicating the positions of the individual chips in the array which are also obtained at the alignment processing device 5. One of the diffused wafers to be bonded, with the positions of the electrodes at the individual chips ascertained as described above, is set on the wafer stage 12 and the other wafer is set at the lower wafer holder 15. In addition, the electrode position data indicating the positions of the electrodes at the individual chips and data indicating the extent of thermal deformation occurring during the heating step are input to the control unit 19 of the stacking apparatus or the database unit mentioned earlier (not shown).

The wafer stage 12 and the diffused wafer W are positioned relative to each other and the lower wafer holder 15 and the diffused wafer W are positioned relative to each other by engaging notches formed at the diffused wafers W at projections formed at the wafer stage 12 and the lower wafer holder 15 so as to mechanically set the diffused wafers W at specific positions.

In addition, the diffused wafer W placed on the wafer stage 12 is set on the wafer stage 12 with its electrode formation surface facing down. It is to be noted that since the electrode formation surface of the diffused wafer W is normally facing up for circuit pattern formation, an inverting mechanism for reversing its sides needs to be used to turn the electrode formation surface down. Such a mechanism for reversing the sides of the diffused wafer may be an articulated robot often employed in semiconductor manufacturing systems and the like.

Next, the upper wafer holder 13 and the diffused wafer W vacuum-held via the chucking unit 14 are carried to a position directly above the lower wafer holder 15. A diffused wafer W is also held at the lower wafer holder 15. It is to be noted that the second transfer unit 17 is in a retreat state at this time, assuming a position away from the area directly above the lower wafer holder 15. The wafer transfer step in FIG. 5 is executed as described above.

Next, the coordinate data to be used in the bonding step are added as shown in FIG. 5. This step is primarily executed by the control unit 19. As explained earlier, the upper wafer holder 13 and the diffused wafer W are positioned relative to each other and the lower wafer holder 15 and the diffused wafer W are positioned relative to each other by mechanically engaging the notches at the diffused wafers W with the projections and thus holding the diffused wafer onto wafer holders. However, the diffused wafer W is still offset from its ideal installation position at the upper wafer holder 13 and the diffused wafer W is offset from its ideal installation position at the lower wafer holder 15, albeit to a slight extent. For this reason, a misalignment error ($\Delta X2$, $\Delta Y2$, $\Delta \theta 2$) attributable to these dislocations must be taken into consideration during the stacking process.

This error ($\Delta X2$, $\Delta Y2$, $\Delta \theta e2$), which can be estimated in advance, is added to the array data (X1$i$, i1$i$). It is to be noted that the misalignment between the diffused wafer W and the upper wafer holder 13 and the misalignment between the diffused wafer and the lower wafer holder 15 may not occur with a high level of reproducibility in some cases. Under such circumstances, alignment microscopes (not shown) disposed in the area above the stage 11$a$ and around the stage 11$a$ at the stacking apparatus may be utilized to measure in advance the extents of misalignment of the diffused wafers W to be stacked one on top of another relative to the upper wafer holder 13 and the lower wafer holder 15 respectively and the resulting data may be used as data equivalent to the misalignment error ($\Delta X2$, $\Delta Y2$, $\Delta \theta 2$) mentioned above.

More specifically, such measurement may be executed as follows. Namely, by using the alignment microscope disposed around the stage 11$a$, the transfer mechanism 18 that carries the upper wafer holder 13 and a range finding means for monitoring the extent of displacement of the transfer mechanism 18, the relative coordinates of the positions of a plurality of chips relative to a fiducial mark at the upper wafer holder 13 are determined and the extent of misalignment relative to the ideal position is thus ascertained. In addition, by using the alignment microscope disposed in the area above the stage 11$a$, the stage 11$a$ at which the lower wafer holder 15 is held and a range finding means for monitoring the extent of displacement of the stage 11$a$, the relative coordinates of the positions of several chips relative to a fiducial mark at the lower wafer holder 15 are determined and the extent of misalignment relative to the ideal position is thus ascertained.

Then, the data indicating the extents of displacements ($\Delta X3i$, $\Delta Y3i$) of the electrodes at the individual chips during the heating process, having been estimated earlier, are incorporated with the data indicating the sum of the electrode array data ($\Delta X1i$, $\Delta Y1i$) and the misalignment error ($\Delta X2$, $\Delta Y2$, $\Delta \theta 2$).

It is to be noted that the data indicating the extent of the displacement ($\Delta X3i$, $\Delta Y3i$) of each electrode alone may be incorporated with the array position data (X1$i$, Y1$i$) corresponding to the electrode, based upon the influence factor of the data, instead. In addition, each set of data indicating the extent of displacement may be weighted before it is incorporated with the corresponding set of electrode array position data.

Next, the control unit 19 executes the step for calculating the relative coordinates of the two wafers, as shown in FIG. 5. The stacking apparatus 1 in the embodiment includes a reflecting prism 21 and a fiducial mark microscope 20 shown in FIG. 3 installed in the positive range along the Y axis in FIG. 1. Through the fiducial mark microscope 20, fiducial marks FM formed at specific positions at the upper wafer holder 13 and the lower wafer holder 15 can be observed simultaneously via the prism mirror 21.

Figure 3:
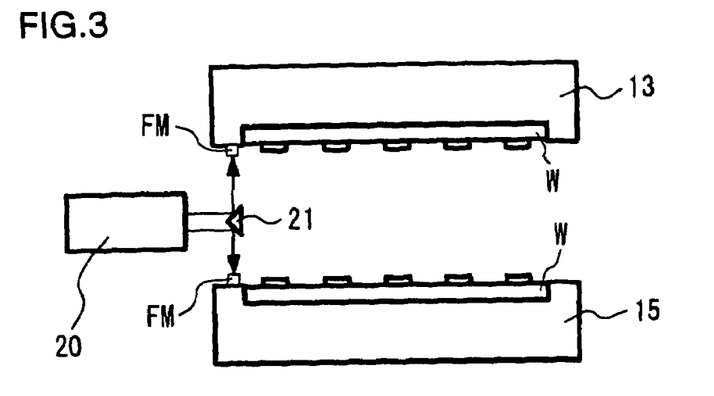
FIG. 3 schematically shows the structure adopted in the misalignment detection mechanism for detecting misalignment of the upper wafer holder 13 and the lower wafer holder 15, mounted at the stacking apparatus 1 in the embodiment.

The extent of misalignment ($\Delta X4$, $\Delta Y4$, $\Delta \theta 4$) manifesting between the upper wafer holder 13 carried on the transfer mechanism 18 and the lower wafer holder 15 can be detected via the fiducial mark microscope 20. The relative coordinates of the positions of the individual electrodes at the two diffused wafers W are calculated based upon the misalignment information thus obtained.

It is to be noted that the upper wafer holder 13 and the lower wafer holder 15 may each include a window formed over the area where the fiducial mark is to be formed, through which infrared light transmitted through Si can be transmitted. In this case, the two fiducial marks formed at the respective windows may be simultaneously detected with a microscope that uses Si-transmitted infrared light in order to monitor the extent of misalignment of the individual wafer holders.

Next, the control unit 19 executes the step for judging whether or not the positions of the two wafers satisfy connection target values, as shown in FIG. 5. Namely, Xu$i$ and Yu$i$ in (Xu$i$, Yu$i$) indicating the position of an electrode at a given chip when the wafer held at the upper wafer holder 13 is heated are expressed as below;

(Expression 1)

$$\begin{pmatrix} Xui \\ Yui \end{pmatrix} = \begin{pmatrix} \cos\Delta\theta 2u & \sin\Delta\theta 2u \\ -\sin\Delta\theta 2u & \cos\Delta\theta 2u \end{pmatrix} \begin{pmatrix} X1ui \\ Y1ui \end{pmatrix} + \begin{pmatrix} \Delta X2u \\ \Delta Y2u \end{pmatrix} + \begin{pmatrix} \Delta X3ui \\ \Delta Y3ui \end{pmatrix} \quad (1)$$

It is to be noted that in the expression above, X1$ui$ and Y1$ui$ represent the electrode array position data for the corresponding chip fixed at the upper holder 13, $\Delta X2u$, $\Delta Y2u$ and $\Delta \theta 2u$ each indicate the difference between the current wafer position at the upper wafer holder 13 relative to the ideal wafer position and $\Delta X3ui$ and $\Delta Y3ui$ each indicate the estimated displacement of the heated electrode.

In addition, X1$i$ and Y1$i$ in (X1$i$, Y1$i$) indicating the position of an electrode at a given chip when the wafer held at the lower wafer holder 15 is heated are expressed as below;

(Expression 2)

$$\begin{pmatrix} Xli \\ Yli \end{pmatrix} = \begin{pmatrix} \cos\Delta\theta 2l & \sin\Delta\theta 2l \\ -\sin\Delta\theta 2l & \cos\Delta\theta 2l \end{pmatrix} \begin{pmatrix} X1li \\ Y1li \end{pmatrix} + \begin{pmatrix} \Delta X2l \\ \Delta Y2l \end{pmatrix} + \begin{pmatrix} \Delta X3li \\ \Delta Y3li \end{pmatrix} \quad (2)$$

It is to be noted that in the expression above, X1$li$ and Y1$li$ represent the electrode array position data at the corresponding chip fixed at the lower holder 15, $\Delta X2l$, $\Delta Y2l$ and $\Delta \theta 2l$ each indicate the difference between the current wafer position at the lower wafer holder 15 relative to the idea wafer position and $\Delta X3li$ and $\Delta Y3li$ each indicate the estimated displacement of the heated electrode.

The data indicating the positions of the heated electrodes (Xli, Yli) and (Xui, Yui) may be corrected by taking into consideration the extents to which the electrodes may become deformed as the wafers are stacked one on top of another, as necessary.

Then, an arithmetic operation is executed based upon the extent to which the fiducial marks are offset from each other, so as to express the positions of the electrodes at the two wafer holders in a single coordinate system. For instance, the position of the electrode at a given chip on the upper wafer holder 13 may be converted to a position in the coordinate system used to express the positions of the chips fixed on the lower wafer holder 15 through the following procedure.

The position of the electrode at a chip on the upper wafer holder 13 can be expressed as a position in the coordinate system (Xuni, Yuni) used to indicate the positions of the chips at the lower wafer holder 15, as expressed in (3) below.
(Expression 3)

$$\begin{pmatrix} Xuni \\ Yuni \end{pmatrix} = \begin{pmatrix} \cos\Delta\theta4 & \sin\Delta\theta4 \\ -\sin\Delta\theta4 & \cos\Delta\theta4 \end{pmatrix} \begin{pmatrix} Xui \\ Yui \end{pmatrix} + \begin{pmatrix} \Delta X4 \\ \Delta Y4 \end{pmatrix} \quad (3)$$

It is to be noted that the letter i in expressions 1 through 3 represents an arbitrary integer assigned so as to assume a common value at the positional coordinates of electrodes coming into contact with each other when the wafers are stacked.

Next, in correspondence to each pair of electrodes, the difference between the position of the electrode at a given chip fixed on the upper wafer holder 13 and the position of the electrode at the corresponding chip fixed on the lower wafer holder 15, which are to be bonded to each other, is determined, and ($\Delta X4$, $\Delta Y4$, $\Delta\theta4$) at which a significant number of electrodes manifest differences under a predetermined range value K is determined.

The predetermined range K may be set as follows.
(Expression 4)

$$\sqrt{(Xuni-Xli)^2+(Yuni-Yli)^2} \leq K \quad (4)$$

An optimal value should be set for K in correspondence to the size of the electrodes or the bumps.

Next, the control unit 19 makes a decision as to whether or not the number of chips, at which a predetermined minimum number of electrodes can be connected when the wafers are stacked under conditions conforming to the values $\Delta X4$, $\Delta Y4$ and $\Delta\theta4$ set as described above, is equal to or greater than a predetermined value. Through this decision-making step, it is determined whether or not "the two wafers satisfy the connection targets" as shown in FIG. 5.

If any data ($\Delta X4$, $\Delta Y4$, $\Delta\theta4$) satisfying the conditions are detected at this time, the control unit 19 controls the stage 11a so as to adjust the position of the stage 11a along the direction X, the direction Y and the direction $\theta$ (the direction of rotation around an axis extending parallel to the Z axis) while monitoring the extent of positional misalignment manifested by the fiducial marks. The upper wafer holder 13 is then lowered toward the lower wafer holder 15, the diffused wafer W at the upper wafer holder 13 is placed over the diffused wafer W on the lower wafer holder 15 and thus, the diffused wafers W are stacked one on top of another.

It is to be noted that the present invention may be adopted in a method other than the method for stacking the two diffused wafers simply by controlling the stage 11a on which the lower wafer holder 15 is held. For instance, the present invention may be adopted in a method for stacking diffused wafers by controlling both the stage supporting the upper wafer holder 13 and the stage supporting the lower wafer holder 15, as long as the upper wafer holder 13 is positioned on a separate stage and fine positional adjustment is enabled.

If, on the other hand, it is decided that the conditions are not satisfied, the control unit 19 evaluates possible dividing patterns with which the diffused wafers W may be divided into small chip blocks. The dividing patterns are evaluated based upon a specific criterion, i.e., chips to be stacked one on top of another in a combination that assures a minimum predetermined number of chips with the numbers of connectable electrodes equal to or greater than a specific value.

Among the chip combination patterns having cleared the criterion, the pattern with the smallest number of small chip blocks is selected, and data indicating how the wafers should be cut into the small chip blocks are output. The data indicating the specific method for cutting the wafers into the small chip blocks thus output are provided to a dicing device through wired or wireless communication or via a recording medium. Then, the two diffused wafers W are carried to the dicing device where they are cut into the small chip blocks based upon the selected dividing pattern.

The resulting small chip blocks are carried back onto the wafer stage 12 and the lower wafer holder 15, and the above mentioned steps are executed so that the small chip block on the wafer stage 12 is set over the small chip block placed on the lower wafer holder 15 together with the upper wafer holder 13. It is to be noted that the misalignment error ($\Delta X2$, $\Delta Y2$, $\Delta\theta2$) of each small chip block relative to the corresponding wafer holder should be detected with a wafer microscope or the like by detecting misalignment relative to the projection formed at the wafer stage 12 or at the lower wafer holder 15.

Once the diffused wafers W or the small chip blocks are layered as described above, the bonding step is executed.

It is to be noted that while the following explanation focuses on bonding of the diffused wafers W, small chip blocks can be bonded in a similar manner.

The bonding step is executed as follows. As explained earlier, the stage 11a is controlled so as to offset the fiducial marks at the upper wafer holder 13 and the lower wafer holder 15 relative to each other by an extent equivalent to ($\Delta X4$, $\Delta Y4$, $\Delta\theta4$). Then, the upper wafer holder 13 is lowered until the wafers at the upper wafer holder 13 and the lower wafer holder 15 come into contact with each other. In this state, pressure is generated between the upper wafer holder 13 and the lower wafer holder 15 via a pressure applying mechanism (not shown) installed at the stage 11a. The pressure should be applied at this time within a range of, for instance, 0.5 to 500 gf per bump.

In addition, the pressure applying mechanism should be a multiple-point pressure applying mechanism capable of applying pressure at various positions. For instance, the pressure applying mechanism may be achieved by disposing a plurality of piezoelectric elements over the surface of the upper wafer holder 13 at which the upper wafer holder 13 is set on the stage 11a is placed. In addition, the level of the pressure being applied should be monitored with a multiple-point load cell monitor to ensure that a uniform bonding force is imparted in the bonding plane. By ensuring that a uniform bonding force is imparted, the electrodes are bonded with a high level of reliability and electrical conduction in the stacked chips is assured.

Next, while a pressure is applied under predetermined pressure application conditions, the upper wafer holder 13 and the lower wafer holder 15 are clamped together via the clamping unit 16 with the diffused wafers W held and pressure bonded thereat. In this state, the chucking unit 14 will have retreated to the right side in FIG. 1 and the second transfer unit 17 carries the upper wafer holder 13 and the lower wafer holder 15 clamped together away from the stage 11a.

Next, the bonding state at the individual electrodes is inspected with an infrared microscope (not shown). If all the bumps are bonded in a desirable manner, the wafers are heated to 450° C. in a heating chamber (not shown) mounted at the stacking apparatus 1 and thus, the metal present between the electrodes becomes fused, thereby completing the bonding process.

Subsequently, the clamping unit 16 is disengaged, the upper wafer holder 13 is disengaged and the upper surface of the upper diffused wafer is machined through a CMP polishing step. As the electrodes become exposed through the CMP step, they become ready to be connected with the outside. An electrical conduction test and the like are performed at this point, and as the stacked wafers are diced into individual chips with the dicing device, stacked chips are obtained.

It is to be noted that while an explanation is given above on an example in which two-layer stacked chips are manufactured, the present invention is not limited to this example. For instance, in order to manufacture stacked chips with three layers or more, the layered diffused wafers with the electrodes thereof having become exposed through the CMP step should be set back at the lower wafer holder 15 of the stacking apparatus 1. Then, a new diffused wafer W is set on the wafer stage 12, and the steps shown in FIG. 5 should be executed repeatedly to obtain stacked chips with three layers or more. It is to be noted that when stacking small chip blocks over three layers or more, the small chip block dividing pattern should be selected by assessing whether or not the bumps at all the wafers to be layered can be connected to one another.

It is to be noted that while the wafers are bonded through diffusion in the example explained above, a bonding method other than diffusion may be adopted. For instance, the surfaces of the diffused wafers W may be cleaned through plasma washing or the like beforehand and the diffused wafers W may then be bonded to each other at normal temperature. Since the wafers are bonded to each other while heating them to 100° C. or higher in this case, too, it is necessary to calculate in advance the extent of displacement of the position of each electrode ($\Delta X3i$, $\Delta Y3i$, $\Delta \theta 3i$) in correspondence to the bonding temperature. In addition, the wafers may be bonded by first metal-bonding the electrodes and then injecting resin into the wafer interface.

Figure 4:
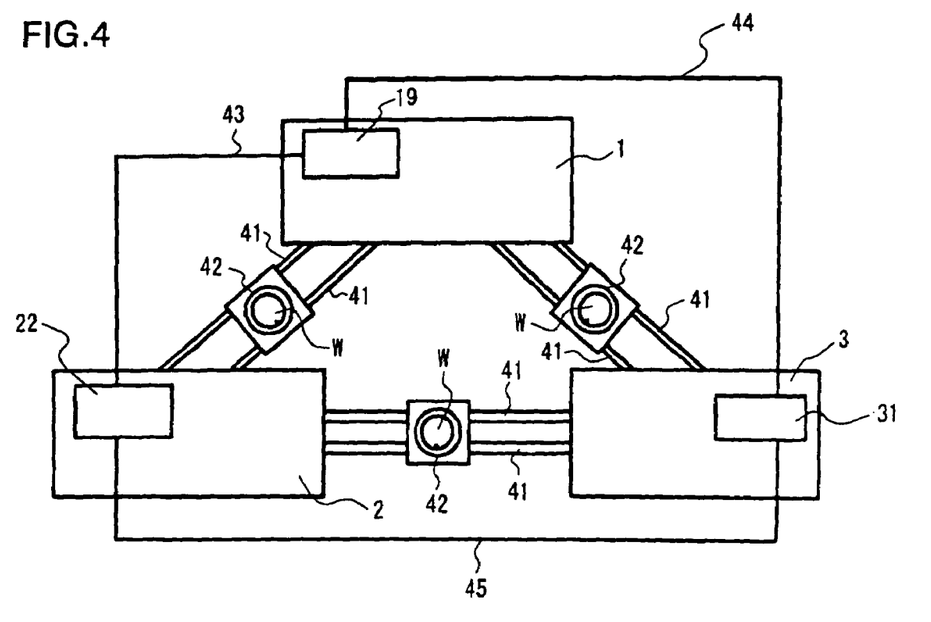
FIG. 4 schematically shows the structure adopted in the three-dimensional integrated circuit stacking system achieved in the embodiment.

In reference to FIG. 4, the three-dimensional stacking system achieved in the embodiment, which may be employed in stacked chip production, is explained.

As shown in FIG. 4, the three-dimensional integrated circuit stacking system in the embodiment comprises the stacking apparatus 1 explained earlier, a preprocessing system group 2 that includes at least a projection exposure apparatus equipped with a control unit 22 and a CMP device and a post-processing system group 3 that includes at least a dicing device equipped with a control unit 31 and a chip selector.

In the system, the stacking apparatus 1, the preprocessing system group 2 and the post-processing system group 3 are connected with one another via transfer paths 41 and transfer stages 42 so that diffused wafers W can be carried back and forth among them. The stacking apparatus 1 receives diffused wafers W from the preprocessing system group 2 and, depending upon the results of the decision made with regard to whether or not the individual diffused wafers W are stackable, the stacking apparatus 1 directs diffused wafers W to the dicing device in the post-processing system group 3, directs stacked diffused wafers W to the CMP device in the preprocessing system group 2 or directs stacked wafers, the upper surface of which has been polished at the CMP device to expose the electrodes, to the post-processing system group 3.

The transfer paths 41 and the transfer devices 42 link the individual system groups so as to enable delivery of diffused wafers W at different phases among the system groups. In addition, in order to enable various types of processing on the individual diffused wafers W in correspondence to their specific states, the various control units are connected via communication paths 43, 44 and 45. At least chip alignment information indicating a state of chip alignment on diffused wafers W, which is obtained at the projection exposure apparatus, is exchanged via the communication path 43, whereas division information needed when obtaining small chip blocks from diffused wafers W is transferred from the control unit 19 to the control unit 31 of the dicing device via the communication path 44.

Furthermore, the control unit of a three-dimensional shape measuring instrument or an image shape measuring device engaged in operation when inspecting the bump height and shape is connected to the communication path 45. The inspection data output to the control unit of the chip selector in the post-processing system group 3 and inspection data indicating the results of the IR microscope inspection of the diffused wafers W pressed against each other and output to the control unit of the chip selector can be used to speed up the process of screening for defective chips.

In addition, while the diffused wafers W, the small chip blocks or the chips are positioned relative to each other and layered by fine-adjusting the position of only one of the stages in the embodiment described above, the present invention is not limited to this example and fine-adjustment stages may be installed at both holders each used to hold a diffused wafer W, small chip blocks and chips.

Furthermore, in the explanation provided above, the alignment processing device that is utilized when ascertaining the coordinates of the positions of the electrodes in the chip array executes the measurement on a stage other than the stage on which the diffused wafers W or the small chip blocks are layered one on top of another. However, the present invention is not limited to this example and a microscope to be used to detect alignment marks at the individual chips may be installed in the vicinity of the stage on which the wafers are layered one on top of another and a microscope to be used to detect the alignment marks may be disposed near the stage on which the wafers or the small chip blocks are stacked one on top of another.

The embodiment adopting the structure described above achieves electrical conduction for chip assemblies stacked one on top of another without requiring any human intervention and thus, a high yield is assured in stacked chip production.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

The disclosure of the following priority application is herein incorporated by reference:

Japanese Patent Application No. 2004-002081 filed Jan. 7, 2004.

What is claimed is:

1. A stacking apparatus in which two chip assemblies are stacked, comprising:
a driving unit configured to move the chip assemblies relative to each other; and
a control unit configured to individually obtain position information of each of a plurality of marks provided on one of the chip assemblies, to individually calculate each of positions of the plurality of marks statistically based upon the obtained position information and to control operation of the driving unit based upon results of the calculation.

2. A stacking apparatus in which two chip assemblies are stacked, comprising:
a driving unit configured to move the chip assemblies relative to each other; and
a control unit configured to control operation of the driving unit, wherein
each of the chip assemblies has a plurality of chips, and
the control unit is configured to obtain first position information of each of at least three marks respectively provided on at least three chips selected among the plurality of chips on one of the chip assemblies, to obtain second position information of each of at least three marks respectively provided on at least three chips selected among the plurality of chips on the other of the chip assemblies and to control the operation of the driving unit based upon the obtained first and second position information.

3. The stacking apparatus according to claim 1, wherein:
the control unit is configured to control the driving unit to relatively move each of the chip assemblies based upon the results of the calculation when the chip assemblies are stacked one on top of another.

4. The stacking apparatus according to claim 2, wherein:
the control unit is configured to control the driving unit to relatively move each of the chip assemblies based upon the obtained first and second position information when the chip assemblies are stacked one on top of another.

5. A stacking apparatus in which two chip assemblies are stacked and at least one chip assembly has a plurality of marks, comprising:
a driving unit that moves the chip assemblies relative to each other;
a control unit that control operation of the driving unit, and
the control unit obtains position information of each of the plurality of marks that are provided on the one chip assembly, and controls the operation of the driving unit based upon the obtained position information to move each of the chip assemblies relatively so that misalignments between each of the plurality of marks and each of corresponding positions provided on another chip assembly achieve minimum as a whole, wherein:
the control unit calculates each of positions of the plurality of marks provided on the one chip assembly statistically based upon the obtained position information of each of the marks, and controls the operation of the driving unit based upon results of the calculation.

6. A stacking apparatus according to claim 5, wherein:
the control unit obtains the position information of each of at least three marks among the plurality of marks provided on the one chip assembly.

7. A stacking apparatus according to claim 5, further comprising:
a measurement unit that measures a position of each of the plurality of marks provided on the one chip assembly, wherein:
the measurement unit measures positions of the at least three marks among the plurality of marks provided on the one chip assembly; and
the control unit obtains the position information of each of the marks from the measurement unit.

8. A stacking apparatus according to claim 5, further comprising:
an alignment information obtaining unit that obtains the position information of each of at least three marks among the plurality of marks provided on the one chip assembly from a projection exposure apparatus that determines circuit patterns to be formed at the one chip assembly, wherein:
the control unit obtains the position information of each of the marks provided at the one chip assembly from the alignment information obtaining unit.

9. A stacking apparatus according to claim 5, further comprising:
a storage unit that stores at least design data with regard to position information of each of marks to be obtained by the control unit, wherein:
the control unit calculates an error parameter of a position of each of the marks with regard to corresponding design data based upon the obtained position information of each of the marks and the corresponding design data stored in the storage unit, and calculates each of the positions of the plurality of marks provided on the one chip assembly statistically based upon the error parameter and the corresponding design data.

10. A stacking apparatus according to claim 5, further comprising:
a first stage where the one chip assembly is held; and
a second stage where the other chip assembly is held and that is capable of facing the first stage so that the one chip assembly and the other chip assembly are to be stacked, wherein:
the driving unit relatively moves the first stage and the second stage.

11. A stacking apparatus according to claim 5, wherein:
the control unit determines positions of the first stage and the second stage based upon misalignments between reference positions of the marks provided at the one chip assembly and a reference position of the first stage, and a misalignment between a reference position provided with the other chip assembly and a reference position of the second stage.

12. A stacking apparatus according to claim 5, wherein:
a pressure application detection unit is provided at least one of the first stage and the second stage.

13. A stacking apparatus according to claim 5, wherein:
each of the chip assemblies has a plurality of chips that are disposed continuously.

14. A stacking apparatus according to claim 5, wherein:
at least one of the chip assemblies is constituted with a chip.

15. A stacking apparatus in which two chip assemblies are stacked and at least one chip assembly has a plurality of marks, comprising:
a driving unit that moves the chip assemblies relative to each other;
a control unit that control operation of the driving unit;

the control unit obtains position information of each of the plurality of marks that are provided on the one chip assembly, and controls the operation of the driving unit based upon the obtained position information to move each of the chip assemblies relatively so that misalignments between each of the plurality of marks and each of corresponding positions provided on another chip assembly achieve minimum as a whole; and a deformation estimation unit that estimates at least an amount of deformation of the one chip assembly when stacking, wherein:

the control unit controls the operation of the driving unit based upon the amount of deformation estimated by the deformation estimation unit and the obtained position information of each of the plurality of marks provided on the one chip assembly.

16. A stacking apparatus according to claim 15, wherein:
the amount of deformation includes an amount of deformation of the one chip assembly due to heating.

17. A stacking apparatus according to claim 15, further comprising:
a division information output unit that generates chip assembly division information in correspondence to a positional relationship between electrodes at the stacked chip assemblies and outputs the chip assembly division information to a dicing device that divides the chip assemblies.

18. A stacking apparatus in which two chip assemblies each having a plurality of marks are stacked, comprising:
a first stage where one chip assembly is held; and
a second stage where another chip assembly is held and that is capable of facing the first stage so that the one chip assembly and the other chip assembly are to be stacked;
a driving unit that relatively moves the first stage and the second stage; and
a control unit that controls operation of the driving unit, wherein:
the control unit obtains position information of each of at least three marks among the plurality of marks provided on at least the one chip assembly, and controls the operation of the driving unit based upon the obtained position information to move the first stage and the second stage relatively so that misalignments of positions of marks corresponding between the one chip assembly and the other chip assembly achieve minimum as a whole, wherein:
the control unit calculates each of positions of the plurality of marks provided on the one chip assembly statistically based upon the obtained position information of each of the marks, and controls the operation of the driving unit based upon results of the calculation.

19. A method for stacking two chip assemblies in which at least one chip assembly has a plurality of marks, comprising:
a position information obtaining step of obtaining position information of each of the plurality of marks that are provided on the one chip assembly;
calculating each of positions of the plurality of marks provided on the one chip assembly statistically based upon the obtained position information; and
moving the chip assemblies relative to each other based upon results of the calculation so that misalignments between each of the plurality of marks and each of corresponding positions provided on another chip assembly achieve minimum as a whole.

20. A method according to claim 19, wherein:
the position information obtaining step includes obtaining the position information of each of at least three marks among the plurality of marks provided on the one chip assembly.

21. A method according to claim 19, further comprising:
measuring, by a measurement unit, a position of each of the plurality of marks provided on the one chip assembly, wherein:
the measuring step includes measuring positions of the at least three marks among the plurality of marks provided on the one chip assembly; and
the position information obtaining step includes obtaining the position information of each of the marks from the measurement unit.

22. A method according to claim 19, further comprising:
obtaining, by an alignment information obtaining unit, the position information of each of at least three marks among the plurality of marks provided on the one chip assembly from a projection exposure apparatus that determines circuit patterns to be formed at the one chip assembly, wherein:
the position information obtaining step includes obtaining the position information of each of the marks provided at the one chip assembly from the alignment information obtaining unit.

23. A method according to claim 19, further comprising:
storing at least design data with regard to position information of each of marks to be obtained in the position information obtaining step, wherein:
an error parameter of a position of each of the marks is calculated with regard to corresponding design data based upon the obtained position information of each of the marks and the corresponding stored design data, and each of the positions of the plurality of marks provided on the one chip assembly is calculated statistically based upon the error parameter and the corresponding design data.

24. A method according to claim 19, further comprising:
holding the one chip assembly at a first stage; and
holding the other chip assembly at a second stage that is capable of facing the first stage so that the one chip assembly and the other chip assembly are to be stacked, wherein:
the moving step includes relatively moving the first stage and the second stage.

25. A method according to claim 24, wherein:
positions of the first stage and the second stage are determined based upon misalignments between reference positions of the marks provided at the one chip assembly and a reference position of the first stage, and a misalignment between a reference position provided with the other chip assembly and a reference position of the second stage.

26. A method according to claim 19, wherein:
a pressure application detection unit is provided at least one of the first stage and the second stage.

27. A method according to claim 19, wherein:
each of the chip assemblies has a plurality of chips that are disposed continuously.

28. A method according to claim 19, wherein:
at least one of the chip assemblies is constituted with a chip.

29. A method for stacking two chip assemblies in which at least one chip assembly has a plurality of marks, comprising:
obtaining position information of each of the plurality of marks that are provided on the one chip assembly;

estimating at least an amount of deformation of the one chip assembly when stacking; and moving the chip assemblies relative to each other based upon the estimated amount of deformation and the obtained position information so that misalignments between each of the plurality of marks and each of corresponding positions provided on another chip assembly achieve minimum as a whole.

30. A method according to claim 29, wherein:

the amount of deformation includes an amount of deformation of the one chip assembly due to heating.

31. A method according to claim 29, further comprising:

generating chip assembly division information in correspondence to a positional relationship between electrodes at the stacked chip assemblies and outputting the chip assembly division information to a dicing device that divides the chip assemblies.

32. A method for stacking two chip assemblies each having a plurality of marks, one chip assembly being held by a first stage and another chip assembly being held by a second stage, the method comprising:

obtaining first position information of each of at least three marks among the plurality of marks provided on at least one chip assembly;

calculating each of positions of the at least three marks statistically based upon the obtained position information; and moving the first stage and the second stage relatively based upon results of the calculation so that misalignments between each of the plurality of marks and each of corresponding positions provided on another chip assembly achieve minimum as a whole.

33. A method for stacking two chip assemblies in which at least one chip assembly has a plurality of marks, comprising:

individually obtaining position information of each of a plurality of marks provided on one of the chip assemblies;

individually calculating each of positions of the plurality of marks statistically based upon the obtained position information; and moving the chip assemblies relative to each other based upon results of the calculation.

34. The method according to claim 33, wherein:

the moving step includes relatively moving each of the chip assemblies based upon the results of the calculation when the chip assemblies are stacked one on top of another.

35. A method for stacking two chip assemblies in which at least one chip assembly has a plurality of marks, each of the chip assemblies having a plurality of chips, the method comprising:

obtaining first position information of each of at least three marks respectively provided on at least three chips selected from among the plurality of chips on one of the chip assemblies;

obtaining second position information of each of at least three marks respectively provided on at least three chips selected from among the plurality of chips on the other of the chip assemblies; and moving the chip assemblies relative to each other based upon the obtained first and second position information.

36. The method according to claim 35, wherein:

the moving step includes relatively moving each of the chip assemblies based upon the obtained first and second position information when the chip assemblies are stacked one on top of another.

* * * * *